(12) United States Patent
Manasson et al.

(10) Patent No.: US 7,777,286 B2
(45) Date of Patent: Aug. 17, 2010

(54) MONOLITHIC SEMICONDUCTOR MICROWAVE SWITCH ARRAY

(75) Inventors: Vladimir Manasson, Irvine, CA (US); Vladimir I. Litvinov, Aliso Viejo, CA (US); Lev Sadovnik, Irvine, CA (US); Aramais Avakian, Pasadena, CA (US)

(73) Assignee: Sierra Nevada Corporation, Sparks, NV (US)

( * ) Notice: Subject to any disclaimer, the term of this patent is extended or adjusted under 35 U.S.C. 154(b) by 371 days.

(21) Appl. No.: 11/939,385

(22) Filed: Nov. 13, 2007

(65) Prior Publication Data
US 2009/0121804 A1 May 14, 2009

(51) Int. Cl.
*H01L 21/329* (2006.01)
(52) U.S. Cl. ............... 257/428; 333/103; 257/E21.352; 438/128
(58) Field of Classification Search ......... 257/428, 257/E21.352; 333/103; 438/128
See application file for complete search history.

(56) References Cited

U.S. PATENT DOCUMENTS

| 5,047,829 | A | * | 9/1991 | Seymour et al. ............. 257/656 |
| 5,272,457 | A | | 12/1993 | Heckaman et al. |
| 5,883,401 | A | | 3/1999 | Pezzani |
| 6,949,985 | B2 | | 9/2005 | Qiu et al. |
| 7,151,499 | B2 | | 12/2006 | Avakian et al. |

OTHER PUBLICATIONS

International Search Report on corresponding PCT application (PCT/US2008/088673) from International Searching Authority (KIPO) dated Apr. 3, 2009.
Written Opinion on corresponding PCT application (PCT/ US2008/ 088673) from International Searching Authority (KIPO) dated Apr. 3, 2009.
Manasson V. et al.; "Monolithic electronically controlled millimeter-wave beam steering antenna"; Silicon Monolithic Integrated Circuits in RF Systems, 1998; Digest of Papers; 1998 Topical Meeting on Ann Arbor, MI, USA, Sep. 17-18, 1998; IEEE, pp. 215-217; XP010324562; ISBN: 0-7803-5288-2; the whole document.

* cited by examiner

*Primary Examiner*—Davienne Monbleau
*Assistant Examiner*—Matthew Reames
(74) *Attorney, Agent, or Firm*—Klein, O'Neill & Singh, LLP

(57) ABSTRACT

A microwave switch array includes a plurality of microwave slotlines, each of which is controlled by a semiconductor switch including a first PIN junction formed by a primary P-type electrode and a primary N-type electrode separated by the slotline. The switches inject a plasma into the slotline in response to a potential applied across the first PIN junction. Each of the switches includes a second PIN junction between the primary P-type electrode and a secondary N-type electrode, and a third PIN junction between the primary N-type electrode and a secondary P-type electrode. Metal contacts connect the primary P-type electrode and the secondary N-type electrode across second PIN junction, and the primary N-type electrode and the secondary P-type electrode across the third PIN junction. The secondary electrodes extract plasma that diffuses away from the first PIN junction, thereby minimizing the performance degrading effects of plasma diffusion.

22 Claims, 4 Drawing Sheets

MONOLITHIC SEMICONDUCTOR MICROWAVE SWITCH ARRAY

CROSS-REFERENCE TO RELATED APPLICATION

Not Applicable

FEDERALLY SPONSORED RESEARCH OR DEVELOPMENT

Not Applicable

BACKGROUND

The present disclosure relates to semiconductor switches for switching, controlling and/or directing electromagnetic radiation, particularly microwave radiation in the portion of the spectrum known as "millimeter waves." Such millimeter wave radiation typically is employed in many radar applications, particularly collision avoidance radar used in various types of vehicles and craft.

Semiconductor microwave switches are known in the art, and have been employed in such applications as steerable or directional antennas, especially dielectric waveguide antennas used to send and receive steerable millimeter wave beams in various types of radar devices, such as collision avoidance radars. In such antennas, semiconductor switches may be employed to provide an antenna element with an evanescent coupling edge having a selectively variable coupling geometry. The coupling edge is placed substantially parallel and closely adjacent to a transmission line, such as a dielectric waveguide. As a result of evanescent coupling between the transmission line and the antenna element when an electromagnetic signal is transmitted through the transmission line, electromagnetic radiation is transmitted or received by the antenna. The shape and direction of the transmitted or received beam are determined by the selected coupling geometry of the evanescent coupling edge, as determined, in turn, by the pattern of electrical connections that is selected for the edge features of the coupling edge. Semiconductor switches may be employed in the antenna element as one mechanism for varying this pattern of electrical connections. See, for example. U.S. Pat. No. 7,151,499 (commonly assigned to the assignee of the present application), the disclosure of which patent is incorporated herein by reference in its entirety.

A typical prior art semiconductor microwave switch array 10 that may be used in an antenna of the aforementioned type is shown in FIG. 1. The prior art switch array 10 is formed on a wafer or substrate 12 of semiconductor material (e.g., Si, Ge, or GaAs) by forming a plurality of PIN junctions, each comprising a P-doped region that serves as a P-type electrode 14, an N-doped region that serves as an N-type electrode 16, and an insulative substrate gap 18 between the two electrodes 14, 16. Successive PIN junctions are separated by an insulative substrate region 20, and the successive PIN junctions are of alternating polarity (i.e. P-I-N, alternating with N-I-P), as shown in FIG. 1. The surface of the substrate 12 is covered by a thin passivation layer, which may be a suitable insulative material, such as $SiO_2$ or $Si_3N_4$, for example. The passivation layer is subjected to a first photolithography process to form a linear passivation region 22 overlying each of the insulative substrate gaps 18. A metal layer (e.g., Ag, Al, Au, Cu, Pt) is then formed or deposited over the surface of the substrate 12 and over the passivation regions 22 by any suitable conventional process (e.g. electroplating or electrodeposition). The metal layer is then subjected to a second photolithography process to form an array of first contacts 24 and an array of second contacts 26, wherein each of the first contacts 24 is separated from its adjacent second contact 26 by an exposed passivation region 22. Each of the first contacts 24 thus connects the P-type electrodes 14 in each adjacent pair of PIN junctions, while each of the second contacts 26 connects the N-type electrodes 16 in each adjacent pair of PIN junctions.

Each of the PIN junctions provides a switch having an "open" state when no potential is applied across the junction, and a "closed" state when a potential above a predefined threshold potential is applied across the junction. When a switch is open, the exposed passivation region 22 provides a "slotline" through which electromagnetic radiation of suitable wavelength may be directed. When a suitable potential is applied across the PIN junction, the switch is closed, and an electron-hole plasma (not shown) is created and injected into the passivation region 22 between the electrodes 14 16, thereby shorting the electrodes. This plasma reflects the electromagnetic radiation, effectively blocking the path of the radiation through the slotline provided by the passivation region 22.

One disadvantage of the prior art semiconductor switch array 10, as described above, is that the plasma created by the application of the potential across the electrodes of each PIN junction switch is not effectively confined to the area in the vicinity of that switch. Thus, in the switch array 10, the plasma created by each PIN junction switch tends to diffuse across the surface of the substrate 12, so that it may "contaminate" other switches and slotlines in the array thereby degrading the performance of those switches and slotlines, and compromising the functioning of the array as a whole. Moreover, within each switch, the plasma tends to diffuse along the length of the slotline, away from the electrodes, thereby degrading the performance of the slotline controlled by that switch.

Thus, it would be a significant improvement in the state of the art to provide a semiconductor microwave switch in which the effects of plasma diffusion are minimized, without compromising the overall performance of the switch or of any array of which the switch forms a part. It would be a further advantage to provide such a switch without substantially increasing the cost of manufacture of the switch or the switch array.

SUMMARY OF THE DISCLOSURE

Broadly, this disclosure, in a first aspect, describes a semiconductor microwave switch, of the type comprising a PIN junction formed by a primary positive (P-type) electrode and a primary negative (N-type) electrode separated by an insulative region that serves as a microwave slotline, characterized in that the PIN junction is a first PIN junction that provides a microwave switching function when a potential is applied across it, and further characterized by a second PIN junction provided between the primary positive electrode and a secondary negative (N-type) electrode, and a third PIN junction provided between the primary negative electrode and a secondary positive (P-type) electrode. The switch includes a first metal contact connecting the primary P-type electrode and the secondary N-type electrode across second PIN junction, and a second metal contact connecting the primary N-type electrode and the secondary P-type electrode across the third PIN junction.

More specifically, the disclosure describes a semiconductor microwave switch comprising a primary P-type electrode, a primary N-type electrode, an insulative (slotline) region separating the primary P-type and N-type electrodes, a secondary N-type electrode separated from the primary P-type electrode by a first insulative gap and connected to the primary P-type electrode by a first metal contact, and a secondary P-type electrode separated from the primary N-type electrode by a second insulative gap and connected to the primary N-type electrode by a second metal contact, wherein the secondary N-type electrode is separated from the secondary P-type electrode by the insulative slotline region.

In another aspect, the present disclosure describes a monolithic array of semiconductor microwave switches, each of which is a semiconductor microwave switch of the type described herein.

In still another aspect, the present disclosure describes a method of manufacturing a monolithic array of semiconductor microwave switches of the type described herein.

As will be better appreciated from the detailed description below, an array of semiconductor microwave switches constructed in accordance with this disclosure minimizes, or at least substantially reduces, the deleterious effects of plasma diffusion, as described above.

As used herein, the term "microwaves" and "microwave radiation" shall include electromagnetic radiation having any wavelength that is suitable for use in radar, communications, and similar applications, including so-called "millimeter waves." Likewise, the term "microwave switch," as used herein, shall include any switch that may be used to control the passage of electromagnetic radiation of any wavelength that is suitable for use in radar, communications, and similar applications.

DETAILED DESCRIPTION OF THE PREFERRED EMBODIMENT

Figure 2:
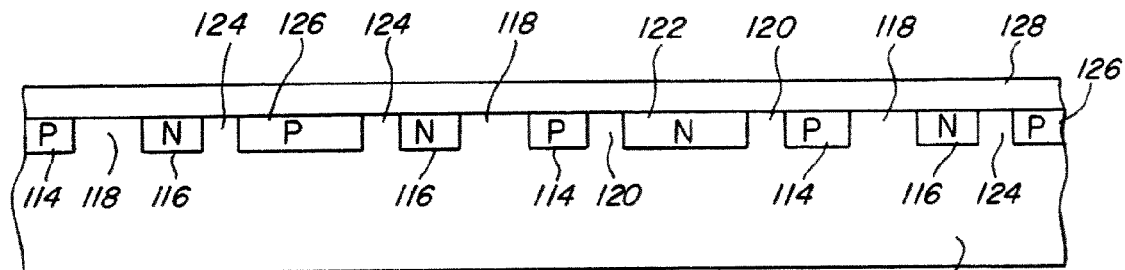
FIGS. 2-5 are semi-schematic cross-sectional views of a semiconductor wafer or substrate showing the steps of fabricating an array of semiconductor microwave switches in accordance with the present disclosure.
Figure 3:
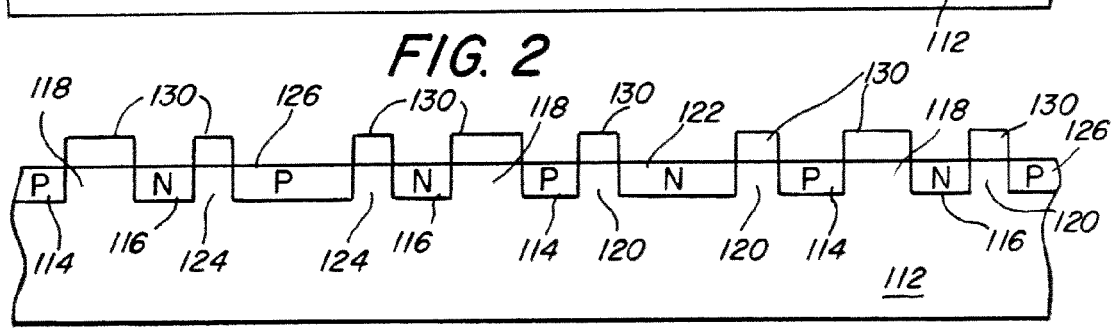
Figure 4:
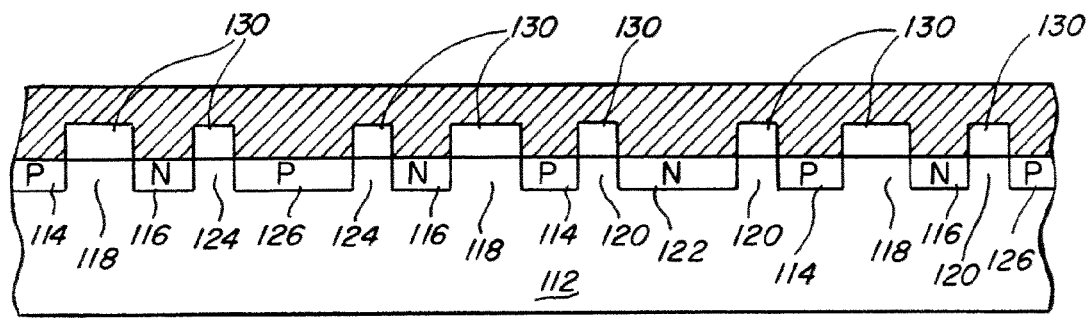
Figure 5:
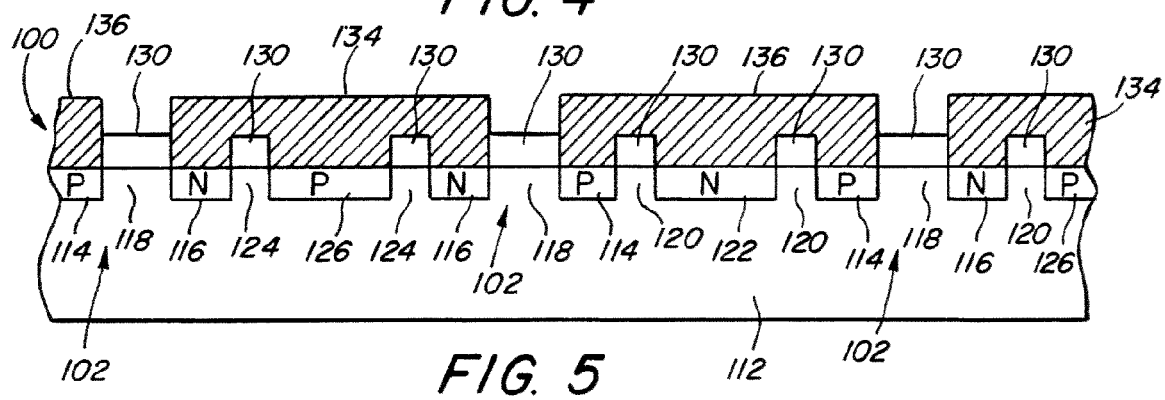
Figure 6:
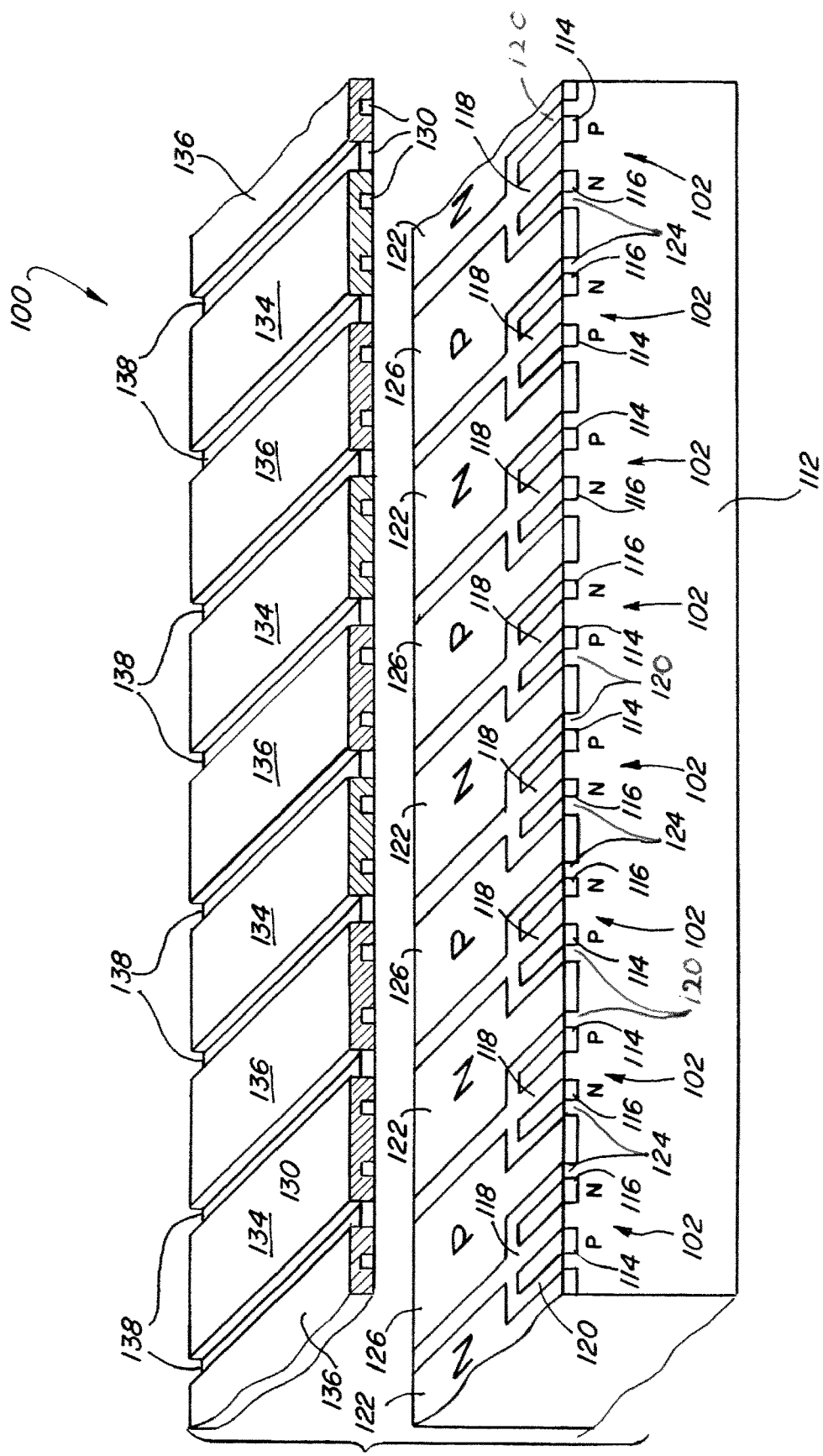
FIG. 6 is a semi-schematic exploded perspective view of an array of semiconductor microwave switches in accordance with the present disclosure.
Figure 7:
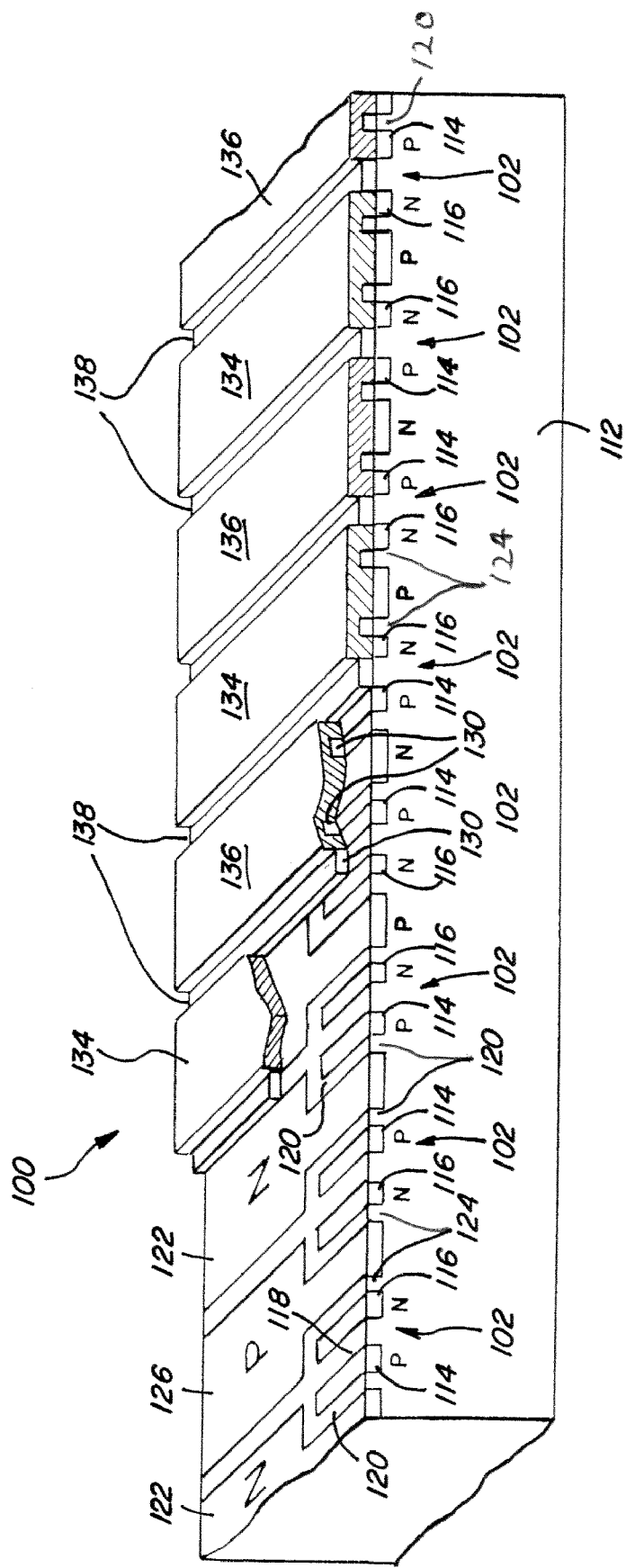
FIG. 7 is a semi-schematic perspective view, partially in cross-section, of an array of semiconductor microwave switches in accordance with the present disclosure.

FIGS. 5, 6, and 7 show a monolithic array 100 of semiconductor microwave switches 102, in accordance with the present disclosure, while FIGS. 2, 3, and 4 show several steps in the fabrication of the array 100. The array 100 of the switches 102 is formed on a wafer or substrate 112 of undoped semiconductor material, such as Si, Ge, or GaAs. Each of the switches 102 is a PIN junction switch, comprising a first PIN junction provided by a first P-doped region that serves as a primary P-type electrode 114 and a first N-doped region that serves as a primary N-type electrode 116, the primary electrodes 114, 116 being separated by an insulative region 118 of undoped substrate material. A second PIN junction is provided by forming a second N-doped region separated from the primary P-type electrode 114 by a first isolation gap 120, the second N-doped region serving as a secondary N-type electrode 122. A third PIN junction is provided by forming a second P-doped region separated from the primary N-type electrode 116 by a second insulative isolation gap 124, the second P-doped region serving as a secondary P-type electrode 126. The secondary N-type electrode 122 is separated from the secondary P-type electrode 126 by the slot 1118. Thus, in the preferred embodiment shown in the drawings, the primary P-type electrode 114 is isolated from the secondary N-type electrode 122 by the first isolation gap 120, and from the primary N-type electrode 116 by the insulative region 118. Similarly, the primary N-type electrode 116 is isolated from the secondary P-type electrode by the second isolation gap 124, and from the primary P-type electrode by the insulative region 118. Although the first and second isolation gaps 120, 124 are shown as right-angle gaps, their actual configuration in practice will be dictated largely by the respective configurations of the primary and secondary electrodes.

In fabricating the array 100, a major surface of an undoped, semiconductive substrate 112 is doped, by conventional methods (diffusion, epitaxy, ion implantation, etc.), to form the P-doped regions and N-doped regions that provide the primary P-type electrodes 114, the primary N-type electrodes 116, the secondary N-type electrodes 122, and the secondary P-type electrodes 126. Each primary P-type electrode 114 is separated from a corresponding primary N-type electrode 116 by an undoped substrate region 118. Each secondary N-type electrode 122 is separated from a corresponding primary P-type electrode 114 by a first isolation gap 120 of undoped substrate material, while each secondary P-type electrode 126 is separated from a corresponding primary N-type electrode by a second isolation gap 124 of undoped substrate material.

A thin passivation layer 128 is then applied to the surface of the substrate 112 that includes the doped regions, as shown in FIG. 2. The passivation layer 128 may be a suitable insulative material, such as $SiO_2$ or $Si_3N_4$, for example. Selected portions of the passivation layer 128 are removed, as by a first photolithography process (masking and etching), for example, to leave a pattern of insulative passivation regions or islands 130 on the substrate surface, as shown in FIG. 3. The passivation regions or islands 130 overly the undoped substrate regions 118 and the first and second isolation gaps 120, 124, respectively.

Next, a layer of conductive metal 132 is formed or deposited, by any suitable conventional method (such as vacuum deposition, sputtering, electron-beam deposition, etc. following by electroplating or electrodeposition, if necessary), over the entire substrate surface so as to cover the electrodes 114, 116, 122, 126 and the passivation regions or islands 130, as shown in FIG. 4. Any suitable conductive metal (e.g., Ag, Al, Au, Cu, Pt, nickel-over-copper) or metal silicide (e.g., $TiSi_2$) may be used for the metal layer 132. Finally, as shown in FIG. 5, selected portions of the metal layer 132 are removed, as by a second photolithography process, for example, to form an array of first metal contacts 134 and an array of second metal contacts 136, with each pair of first and second metal contacts 134, 136 being separated by an exposed passivation region 130 overlying each of the insulative regions 118 of the substrate 112. Each of the first contacts 134 is disposed on one of the secondary P-type electrodes 126 and the two primary N-type electrodes 122 on either side of it so as to bridge these three electrodes across the first and second isolation gaps 120, 124. Similarly, and simultaneously, each of the second metal contacts 136 is disposed on one of the secondary N-type electrodes 122 and the two primary P-type electrodes 114 on either side of it so as to bridge these three electrodes across the first and second isolation gaps 122, 124. The array of first and second metal contacts 134, 136 thus covers all of the surface of the substrate 112, except for the exposed passivation regions 130 overlying the insulative regions 118 of the substrate 112. In the resultant structure, as shown in FIGS. 5-7, a microwave slotline 138 is provided by each of the exposed passivation regions 130 separating a contact pair 134, 136, whereby each slotline 138 is located between a primary P-type electrode 114 and a corresponding primary N-type electrode 116.

Figure 1:
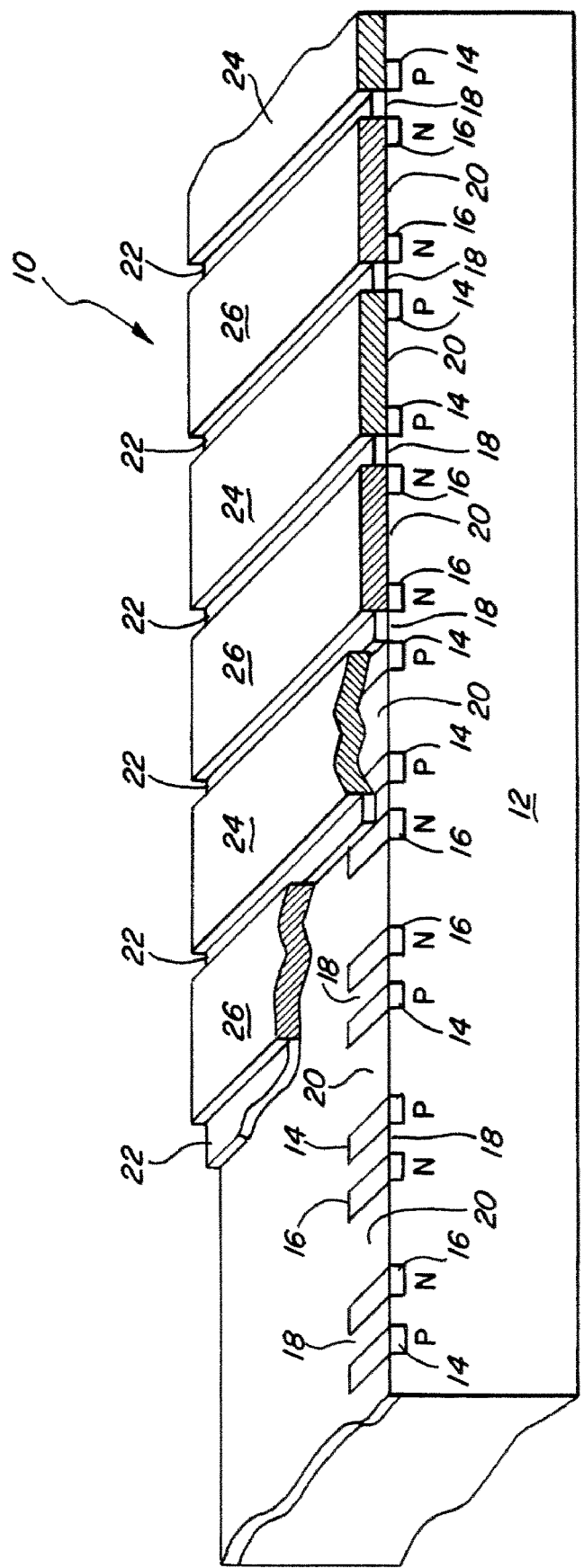
FIG. 1 is a semi-schematic perspective view, partially in cross-section, of an array of typical prior art semiconductor microwave switches.

As in the prior art switch of FIG. 1, the selective application of a potential across the first PIN junction (i.e., between the primary electrodes 114, 116 across the slotline 138) creates an electron-hole plasma that is injected into the slotline 138, blocking the propagation of electromagnetic radiation along the length of the slotline 138. When the potential is removed from the first PIN junction, plasma injection ceases, and propagation of the radiation through the slotline 138 is permitted. In the embodiment of FIGS. 5-7, however, the electrical contact provided by the metallized contacts 134, 136 between each of the secondary electrodes 122, 126 and its respective primary electrode 114, 116 has the effect of localizing the injected plasma to a portion of the slotline 138 that is in or in close proximity to the region directly between the primary electrodes 114, 116. This localization of the plasma minimizes, or at least substantially reduces, the diffusion of the plasma away from the first PIN junction that provides the microwave switching function. In this way, the plasma used to block the microwave propagation through the slotline 138 is substantially confined to the area where the desired switching is to take place, and the diffusion of the plasma away from this area is substantially reduced. As a result, the performance of each individual switch is not significantly degraded by the diffusion of its own injected plasma along the length of the slotline 138, nor are the switches in an array of such switches deleteriously affected by plasma diffusing from neighboring slotlines in the array.

In operation, when a potential is applied across the primary electrodes 114, 116 so that they are forward biased, the P-type primary electrode 114 injects holes into the slotline 138, while the N-type primary electrode 116 injects electrons. The injected holes and electrons form the injected plasma. The secondary electrodes 122, 126, being unbiased (because the contacts 134, 136 put them at the same potential as their respective primary electrodes), effectively extract the plasma that is in their vicinity, with the secondary N-type electrode 122 extracting electrons, and the secondary P-type electrode 126 extracting holes. The plasma extraction is based on the "drift" phenomenon, in which the charged plasma particles drift in the "built-in" or inherent electric fields created at the second and third PIN junctions. This drift phenomenon is several orders of magnitude more efficient than the diffusion of the plasma away from the first PIN junction, thereby providing a highly effective and efficient collection of the electrons and holes by the secondary N-type electrode 122 and the secondary P-type electrode 126, respectively. Accordingly, the secondary electrodes 122, 126, by effectively collecting the plasma through the drift phenomenon, keep the plasma from diffusing away from the first PIN junction formed by the primary electrodes 114, 116 and the slotline 138.

As will be appreciated from the above description, by virtue of the secondary N-type electrodes 122 and the secondary P-type electrodes 126, each of the switches 102 in the array 100 is allowed to function with optimum efficiency, and with a minimum of performance-degrading interference from plasma diffusion, either along the slotline of that switch, or from other switches in the array. As a result very precise operation of the array 100 is permitted, making the array 100 particularly advantageous for use in a beam-shaping or "steerable" microwave antenna, of the type described above.

While a preferred embodiment has been described herein, it will be appreciated that various modifications and variations may suggest themselves as equivalents to the disclosed embodiment. Such variations and modifications as may be considered equivalents are encompassed within the scope of this disclosure and of the claims that are appended hereto and are a part hereof.

What is claimed is:

1. A semiconductor microwave switch of the type comprising a PIN junction formed by a primary P-type electrode and a primary N-type electrode separated by an insulative slotline through which passage of microwave radiation is controlled by the selective application of a potential across the PIN junction, characterized in that the PIN junction is a first PIN junction that provides a microwave switching function when the potential is applied across it, and further characterized by:
    a second PIN junction provided between the primary P-type electrode and a secondary N-type electrode:
    a first metal contact connecting the primary P-type electrode and the secondary N-type electrode across the second PIN junction;
    a third PIN junction provided between the primary N-type electrode and a secondary P-type electrode; and
    a second metal contact connecting the primary N-type electrode and the secondary P-type electrode across the third PIN junction.

2. A monolithic array of semiconductor microwave switches, each of which is a semiconductor microwave switch as defined in claim 1.

3. A semiconductor microwave switch, comprising:
    a primary P-type electrode;
    a primary N-type electrode;
    an insulative slot separating the primary P-type and N-type electrodes;
    a secondary N-type electrode separated from the primary P-type electrode by a first insulative gap;
    a first metal contact connecting the secondary N-type electrode and the primary P-type electrode;
    a secondary P-type electrode separated from the primary N-type electrode by a second insulative gap; and
    a second metal contact connecting the secondary P-type electrode and the primary N-type electrode;
    wherein the secondary N-type electrode is separated from the secondary P-type electrode by the insulative slot.

4. A monolithic array of semiconductor microwave switches, each of which is a semiconductor microwave switch as defined in claim 3.

5. A monolithic array of semiconductor microwave switches, comprising:
    a substrate of undoped semiconductor material;
    a first plurality of P-doped regions in the substrate, each of which provides a primary P-type electrode;
    a first plurality of N-doped regions in the substrate, each of which is separated from one of the first plurality of P-doped regions by an insulative region of the substrate, each of the first plurality of N-doped regions providing a primary N-type electrode, whereby a first PIN junction is formed by each of the primary P-type electrodes, a corresponding one of the primary N-type electrodes, and the insulative region separating them,
    a second plurality of N-doped regions in the substrate, each of which is separated from one of the first plurality of P-doped regions by a first insulative gap of undoped substrate material, each of the second plurality of N-doped regions providing a secondary N-type electrode, whereby a second PIN junction is formed by each of the secondary N-type electrodes, a corresponding one of the primary P-type electrodes, and the first insulative gap separating them;

a first plurality of metal contacts, each of which connects one of the secondary N-type electrodes to its corresponding primary P-type electrodes across the one of the second PIN junctions formed therebetween;

a second plurality of P-doped regions in the substrate, each of which is separated from one of the first plurality of N-doped regions by a second insulative gap of undoped substrate material, each of the second plurality of P-doped regions providing a secondary P-type electrode, whereby a third PIN junction is formed by each of the secondary P-type electrodes, a corresponding one of the primary N-type electrodes, and the second insulative gap separating them; and a second plurality of metal contacts, each of which connects one of the secondary P-type electrodes to its corresponding primary N-type electrodes across the one of the third PIN junctions formed therebetween.

6. A semiconductor microwave switch, comprising:

a substrate of semiconductive material;

a first P-doped region in the substrate forming a primary P-type electrode;

a first N-doped region in the substrate forming a primary N-type electrode, the primary P-type electrode and the primary N-type electrode being separated by an undoped substrate region, whereby the primary P-type electrode, the undoped substrate region, and the primary N-type electrode form a first PIN junction;

a second N-doped region in the substrate forming a secondary N-type electrode separated from the primary P-type electrode by a first gap of undoped substrate material, whereby the secondary N-type electrode, the first gap, and the primary P-type electrode form a second PIN junction;

a first metal contact connecting the secondary N-type electrode and the primary P-type electrode across the second PIN junction:

a second P-doped region in the substrate forming a secondary P-type electrode separated from the primary N-type electrode by a second gap of undoped substrate material, whereby the secondary P-type electrode, the second gap, and the primary N-type electrode form a third PIN junction; and a second metal contact connecting the secondary P-type electrode and the primary N-type electrode across the third PIN junction.

7. The semiconductor microwave switch of claim 6, wherein the secondary N-type electrode is separated from the secondary P-type electrode by the undoped substrate region, and wherein the undoped substrate region forms a microwave slotline that is switchable by the selective application of a potential across the first PIN junction.

8. A monolithic array of semiconductor microwave switches, each of which is a semiconductor microwave switch as defined in claim 6.

9. A monolithic array of semiconductor microwave switches, each of which is a semiconductor microwave switch as defined in claim 7.

10. In a semiconductor microwave switch for controlling the passage of microwaves through a slotline, the switch being of the type in which the slotline passes between a primary P-type electrode and a primary N-type electrode formed in a substrate of semiconductive material, and in which the Primary P-type electrode, slotline, and the primary N-type electrode form a first PIN junction, whereby the passage of the radiation through the slotline is controlled by the selective application of a potential across the first PIN junction the improvement comprising:

a second PIN junction formed by the primary P-type electrode and a secondary N-type electrode formed in the substrate and separated from the primary P-type electrode by a first gap of substrate material, a first metal contact connecting the primary P-type electrode and the secondary N-type electrode across the second PIN junction;

a third PIN junction formed by the primary N-type electrode and a secondary P-type electrode formed in the substrate and separated from the primary N-type electrode by a second gap of substrate material; and a second metal contact connecting the primary N-type electrode and the secondary P-type electrode across the third PIN junction;

wherein the secondary N-type electrode and the secondary P-type electrode are separated by the slotline.

11. A monolithic array of semiconductor microwave switches, each of which is a semiconductor microwave switch as defined in claim 10.

12. A method of fabricating a monolithic array of semiconductor microwave switches, the method comprising:

(a) providing a substrate of undoped semiconductive material having a major surface, (b) doping the major surface of the substrate to form a plurality of primary P-type electrodes, a plurality of primary N-type electrodes, a plurality of secondary N-type electrodes, and a plurality of secondary P-type electrodes, each of the primary P-type electrodes being separated from a corresponding one of the primary N-type regions by an undoped substrate region;

(b) covering the major surface with an insulative passivation layer;

(c) removing selected portions of the passivation layer to leave a pattern of insulative passivation regions or islands on the substrate major surface at least some of the passivation regions or islands overlying the undoped substrate regions;

(d) forming a layer of conductive metal over the substrate major surface so as to cover the passivation regions or islands; and (e) removing selected portions of the metal layer to form an array of first metal contacts and an array of second metal contacts, each pair of first and second metal contacts being separated by an exposed passivation region or island overlying each of the undoped substrate regions;

wherein each of the first contacts connects one of the secondary P-type electrodes and a primary N-type electrode on either side of it, and wherein each of the second metal contacts connects one of the secondary N-type electrodes and a primary P-type electrode on either side of it;

whereby a microwave slotline is provided by each of the exposed passivation regions separating one of the first contacts from a corresponding one of the second contacts, and whereby each slotline is located between one of the primary P-type electrodes and a corresponding one of the primary N-type electrodes.

13. The method of claim 12, wherein at least one of the steps of removing selected portions of the passivation layer and removing selected portions of the metal layer is performed by photolithography.

14. The method of claim 12, wherein the doping step is performed so that each of the secondary N-type electrodes is separated from a primary P-type electrode on either side of it by a first isolation gap of undoped substrate material, and each of the secondary P-type electrodes is separated from a primary N-type electrode on either side of it by a second isolation gap of undoped substrate material.

15. The method of claim 14, wherein the step of removing selected portions of the passivation layer is performed so that the passivation regions or islands overly the undoped substrate regions and the first and second isolation gaps.

16. The method of claim 15, wherein the step of removing selected portions of the metal layer is performed so that each of the first contacts connects one of the secondary N-type electrodes with the primary P-type electrodes on either side of it across one of the first isolation gaps, and so that each of the second contacts connects one of the secondary P-type electrodes with the primary N-type electrodes on either side of across one of the second isolation gaps.

17. A monolithic semiconductor microwave switch array, of the type comprising a plurality of microwave slotlines formed in a semiconductive substrate, wherein each of the slotlines is controllable by a PIN junction switch in the substrate that is operable by the selective application of a potential across the PIN junction switch to inject a plasma into the slotline, characterized in that each of the PIN junction switches is formed by a first PIN junction, and further characterized by a plurality of second PIN junctions and a plurality of third PIN junctions formed in the substrate and configured and located with respect to the first PIN junctions so as to extract plasma diffusing away from the first PIN junctions, thereby confining the injected plasma to the portion of each slotline in the proximity of each of the first PIN junctions.

18. The monolithic semiconductor switch array of claim 17, wherein the second and third PIN junctions extract the plasma by means of the plasma drift phenomenon.

19. The monolithic semiconductor switch array of claim 17, wherein each of the second PIN junctions and each of the third PIN junctions are located on opposite sides of one of the first PIN junctions.

20. The monolithic semiconductor switch array of claim 17, wherein the each of the first PIN junctions is provided by a primary P-type electrode formed in the substrate, a primary N-type electrode formed in the substrate, and a portion of one of the slotlines located between the primary P-type electrode and the primary N-type electrode.

21. The monolithic semiconductor switch array of claim 20, wherein each of the second PIN junctions is formed by a secondary N-type electrode formed in the substrate, a corresponding one of the primary P-type electrodes, and an isolation gap of undoped substrate material therebetween, and wherein each of the third PIN junctions is formed by a secondary P-type electrode formed in the substrate, a corresponding one of the primary N-type electrodes, and an isolation gap of undoped substrate material therebetween.

22. The monolithic semiconductor switch array of claim 21, further comprising:
a plurality of first metal contacts, each of which connects one of the secondary N-type electrodes with one of the primary P-type electrodes on either side of it; and
a plurality of second metal contacts, each of which connects one of the secondary P-type electrodes with one of the primary N-type electrodes on either side of it.

* * * * *